United States Patent [19]

Burack et al.

[11] Patent Number: 5,024,873

[45] Date of Patent: Jun. 18, 1991

[54] COMPOSITE FILMS WITH LANGMUIR-BLODGETT COMPONENT

[75] Inventors: John J. Burack, Elizabeth; Jane D. LeGrange; Wesley P. Townsend, both of Princeton, all of N.J.

[73] Assignee: AT&T Bell Laboratories, Murray Hill, N.J.

[21] Appl. No.: 280,074

[22] Filed: Dec. 5, 1988

[51] Int. Cl.$^5$ .............................................. B32B 27/00
[52] U.S. Cl. ................................ 428/220; 428/473.5; 428/901; 525/436
[58] Field of Search ..................... 428/473.5, 220, 901; 525/436

[56] References Cited

U.S. PATENT DOCUMENTS 4,696,838  9/1987  Miyata et al. .
4,822,853  4/1989  Uekita et al. ........................ 525/436

OTHER PUBLICATIONS

"Langmuir-Blodgett Films", Petty, M. C., pp. 65-69, *Endeavour, New Series*, vol. 7, No. 2, published in Great Britain, 1983.
"A Moisture Protection Screening Test for Hybrid Circuit Encapsulants", Mancke, R. G., pp. 492-498, *IEEE Transactions on Components, Hybrids and Manufacturing Technology*, vol. CHMT-14, No. 4, Dec. 1981.
"InGaAs Metal Semiconductor Field-Effect Transistor with Langmuir-Blodgett Deposited Gate Structure", Chan, W. K. et al., pp. 220-223, *IEEE Electron Device Letters*, vol. 9, No. 5, May 1988.
"Preparation of Polyimide Mono- and Multilayer Films", M. Kakimoto et al., *Polymers for High Technology*, Chapter 41, pp. 484-495, published in 1987 by the American Chemical Society.
"Preliminary Information Bulletin Spin Coating Techniques", Bulletin #PC-2, published by DuPont Company, May 1985.
"Langmuir-Blodgett Films-the Ultrathin Barrier", Pitt, C., pp. 226-229, *Electronics & Power*, Mar. 1983.

*Primary Examiner*—Edith Buffalow
*Attorney, Agent, or Firm*—R. F. Kip, Jr.

[57] ABSTRACT

A Langmuir-Blodgett monolayer polyimide film and a bulk amorphous polyimide film are in contacting superposed relation to form a composite film having improved moisture resistance. The composite film may be either a free film or provide an insulating coating on the surface of a microelectronics device.

8 Claims, 3 Drawing Sheets

COMPOSITE FILMS WITH LANGMUIR-BLODGETT COMPONENT

FIELD OF THE INVENTION

This invention relates generally to thin films adapted for use on substrates and/or in other contexts. More particularly, this invention relates to (a) films of such sort which are composite films having a Langmuir-Blodgett component, and (b) articles comprising such a composite film and one or more other elements.

BACKGROUND OF THE INVENTION

In chapter 41 of the publication entitled *Polymers for High Technology* published in 1987 by the American Chemical Society, in an article entitled "Preparation of Polyimide Mono- and Multilayer Films" (incorporated herein by reference and made a part hereof), the authors Kakimoto et al begin by mentioning that aromatic polyimides have been widely used as insulating materials in microelectronics, recent developments in this field toward higher integration of devices required ultra thin films of polyimides, and the minimum thickness of polyimide films cast by spin coating was about 1 micron. The authors then go on to disclose another type of ultra thin film, namely Langmuir-Blodgett films of polyimide.

Langmuir-Blodgett ("L-B") films are a family of films named after the scientists, Irving Langmuir and Katherine Blodgett, who were, respectively, the first to undertake scientific research on such films and the first to deposit them in multilayer form on substrates. As an initial step in the preparation of a Langmuir-Blodgett film, there is floated on a body of water (or other aqueous medium) a quantity of a substance comprising molecules which are polarized in the sense that these molecules each have a hydrophobic end and an opposite hydrophilic end. A material constituted of molecules of such sort is known as an amphiphilic material.

The substance so floated is allowed to spread on the water's surface until it forms at the air-water interface a monomolecular layer ("monolayer") in the thickness dimension of which the molecules of the amphiphilic material are mostly oriented in the same direction in that the hydrophilic or "head" end of the molecules extend toward the water and the hydrophobic or "tail" end of such molecules extend toward the air. Depending on the density of packing of the molecules in the two dimensions of the interface, such monomolecular Langmuir-Blodgett film can be either in the gaseous, liquid or solid phase.

By techniques well-known in the art, a Langmuir-Blodgett monolayer so formed at such an interface can be transferred to a substrate by drawing the substrate from the air into the water (or conversely) so as to intercept the monolayer and cause its deposit on the substrate while, concurrently, the surface pressure of the floating monolayer is regulated. The result is a deposited Langmuir-Blodgett monolayer film. By successive transversals in opposite directions of the substrate between the water and the air, it is possible to deposit successive monolayers providing on the substrate a Langmuir-Blodgett multilayer film consisting of a multiplicity of monolayers stacked seriatim in a laminar structure. In such structure, the molecules in each monolayer are ideally, as previously described, all oriented to all have the same pointing direction in the thickness of the monolayer. Moreover, it often happens that many or almost all of the molecules in each monolayer on the inside of such structure are coupled head-to-head and tail-to-tail with the molecules in adjacent monolayers on opposite sides of the first-named monolayer. Such coupling produces an ordering in the film of its constituent monolayers in relation to each other. While such a multilayer Langmuir-Blodgett film may in some instances later be modified by processing to more or less eliminate the polar character of its molecules, there is evidence that such mutual ordering of the layers remains to some degree. In any event, the multilayer film as so modified is still referred to as a Langmuir-Blodgett film.

Returning to the Kakimoto et al article, its authors disclose therein (a) the providing of a silicon wafer having evaporated aluminum lines on a surface thereof, (b) the deposition on such surface and over such lines, by the methods described above, of a Langmuir-Blodgett film which may be either monolayer or multilayer, and the initial amphiphilic material of which films consists of a polyamic acid salt, and (c) the subsequent curing of the film to remove the long alkyl chains of the salt and to convert the films into a Langmuir-Blodgett polyimide film. The L-B films so formed varied in number of layers from 1 layer to 120 layers. The electrical characteristics of such films were investigated, and it was concluded that they have insulating characteristics comparable to normal polyimide films.

The Kakimoto et al article fails to disclose anything about the resistance of thin films to moisture, or to recognize any problems that may arise from exposure of such films to moisture or (it inevitably follows) to suggest any solution for such problems. Moreover, there is no disclosure in the Kakimoto et al. article of thin films which are composite in the sense that such films comprise an L-B component film and another component film of different character.

SUMMARY OF THE INVENTION

In contrast to the disclosure of the mentioned article, we have studied the effect of exposure of thin films to a moist environment. As a result of one such study made prior to reaching the invention hereof, we have found that exposure of such sort often leads to degradation with time of the desired behavior of the films and, in instances, renders the film readily susceptible to delamination from a substrate therefor. We further discovered, however, in the course of such study that multilayer L-B films are significantly more moisture resistant in conditions of high humidity (e.g., are less susceptible to such degradation and possible delamination) than are thin films produced by some other method, as for example, by spin casting.

In order, however, to put such discovery to practical use, it was necessary, we found, to overcome the following problem. It was evident from our studies that, if the thin film considered was entirely an L-B film, the desired moisture resistant qualities could be imparted to the film by the inclusion therein of only a few monolayers, e.g., less than 10 monolayers. Assuming, however, a thickness for each monolayer of between 30-40 Angstrom units (which are typical thickness values for L-B monolayers), the total thickness of the L-B multilayer film would be less than 0.1 micron. This, however, might well in practical applications not be nearly a great enough thickness for the film for its intended use. Thus, for example, if the film is a film of dielectric material intended for use as an insulative coating, it is often desirable for it to have a minimum thickness of 0.5 micron in order to provide for it the appropriate insulating characteristics and to lower the risk of the film's voltage breakdown, which (risk) varies inversely with film thickness.

An alternative approach which would permit the thin film to be composed entirely of an L-B film and still have the characteristics needed for the film for its intended use would be to incorporate a great many more monolayers into the L-B film so as, by that expedient, to increase the thickness of the films to its minimum value necessary for such use. That approach has, however, the disadvantage of increasing the cost of the film to a point at which the cost might well become prohibitive.

We have discovered that we can overcome the problem just described while improving the resistance of thin films to moisture by, according to one aspect of the invention, fabricating such films to be composite films comprising a first component film of dielectric material, and a second component Langmuir-Blodgett film prepared from amphiphilic material and much thinner than such first film, such two films being in superposed relation, and the Langmuir-Blodgett film imparting improved moisture resistance to the composite film. In contrast to the multilayer L-B films the moisture resistance of which was investigated during the mentioned prior study, such component L-B film may (but need not necessarily be) a monolayer.

Moreover, according to the invention in another of its aspects, there are provided articles comprising a substrate body and such a composite film adhering to said body and of the character described above.

A composite film, according to the invention, does not necessarily exclude one or more component thin films in addition to the first and second component films described above. While the invention will be described primarily in its application to composite films having use for electrical purposes, the invention is also of application in other contexts such as optical devices wherein, for example but without restriction, a film of dielectric material is used as an optical waveguide. Moreover, the invention does not necessarily exclude composite films and articles of the kinds described above in which the Langmuir-Blodgett film is included in the composite film for a purpose other than primarily for providing improved moisture resistance.

BRIEF DESCRIPTION OF THE DRAWINGS

For a better understanding of the invention, reference is made to the following descriptions of exemplary embodiments thereof and of methods and tests relating to such embodiments, and to the accompanying drawings wherein.

DETAILED DESCRIPTION OF EMBODIMENTS

By way of introduction to this section, various types of organics and inorganics are commonly used in the electronics industry as dielectric materials. The electrical behavior of such materials in moist environments may vary, but in general, most of the desired electrical properties will degrade with time. This invention, in an aspect thereof, relates to a method of using a composite film to improve the electrical behavior of a material without affecting the desired electrical properties of the material.

To be more specific about one material usable in the realization of the invention, polyimide films are commonly used as interlevel dielectrics in hybrid integrated circuits. A common problem with this material is that the electrical properties are known to degrade in the presence of moisture. A solution discovered by us to this problem is the use of a composite film consisting of a bulk amorphous polyimide film and an ultra-thin Langmuir-Blodgett layer. The addition of the L-B layer to the bulk film greatly improves its performance in moist environments without affecting the desired electrical behavior of the bulk film.

Figure 1:
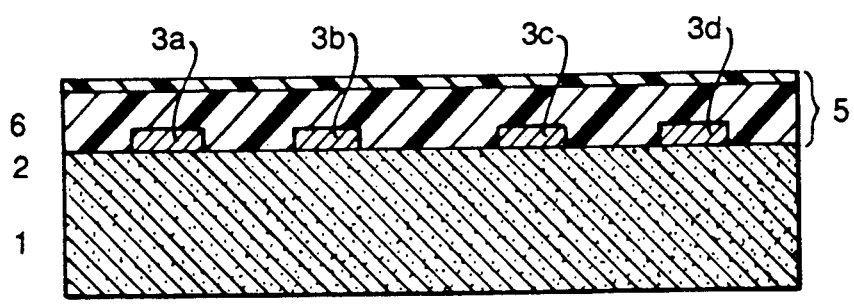
FIG. 1 is a schematic representation not-to-scale in vertical cross-section of an article according to the invention.

Referring now to FIG. 1, that figure depicts schematically an AVP (advanced packaging) microelectronics device comprising (as is well known in the microelectronics art) a base supporting in spaced relation thereon a plurality of electrically interconnected semiconductor chips (not shown) each bearing a large number of integrated circuits formed thereon. In the AVP device of FIG. 1, the base of the device is provided by a monolithic substrate body 1 of silicon, a semiconductive material. In other articles according to the invention, the substrate body may be constituted of metallic material, of ceramic material (such as silica), or of any other material permitting adherence to the surface thereof of a composite film according to the invention.

Substrate body 1 has on its upper surface 2 a plurality of thin film conductors 3a, 3b, 3c, 3d disposed on spaced relation on surface 2 and adhering to such surface and constituted of, say, aluminum deposited by vacuum evaporation. The conductors are electroconductive microelectronics circuit elements in that they serve in the FIG. 1 AVP device to electrically interconnect the various clusters of integrated circuits on, respectively, the mentioned plurality of semiconductor chips (not shown) also mounted in spaced relation from each other on the upper surface 2 of substrate body 1.

Firmly adhering to that surface is a composite film 5 extending over and coating the metallized circuit elements 3 and surface areas therebetween of body 1. Film 5 consists of a first component bulk film 6 of isotropic dielectric material and a second component film 7 which is a Langmuir-Blodgett film prepared from amphiphilic material. In the FIG. 1 device, the bulk and L-B film components are positioned within the composite film 5 to be relatively inward and outward, respectively, in relation to the substrate body 1. The film components 6 and 7 firmly adhere together to form the composite film 5.

Considering first film 6, that film is a bulk amorphous polyimide film initially formed by spin casting on the surface 2 of body 1 (with conductors 3 thereon) a polyimide material designated by the Du Pont Company as PI-2555 and available from that company (at its address given as Photosystems & Electronic Products Department, Electronics Materials Division, Barley Mill Plaza, Reynolds Mill Building, Wilmington, DE 19898) under the brand name PYRALIN ®. Appropriate techniques for producing the spun cast film 6 are described in a bulletin published by the Du Pont Company and available from it at the above address and entitled "Preliminary Information Bulletin Spun Coating Techniques", such bulletin being incorporated herein by reference and made a part hereof.

Film 6 in the FIG. 1 device has a thickness of about 2 microns. For applications in microelectronics devices, the film should be ultra-thin so as to have a thickness between and including a lower limit of 0.5 micron and an upper limit of 10 microns, with the preferred range being between and including 0.5 micron and 2.5 micron. In the film 6, the constituent polyimide material is amorphous and isotropic with respect to its electrical and other physical properties.

In the FIG. 1 device, the primary function of the composite film 5 is to provide adequate insulation for the conductors 3 on the substrate body 1. In order to do so, the film 5 must have a certain minimum thickness of dielectric material, and that thickness is almost entirely provided by the material of film 6.

In articles according to the invention which are other than the FIG. 1 device as disclosed above, the film 6 may be of different character than that so far described. For example, the film can be constituted of other polymide materials such as the ones available from the Du Pont Company and identified as PI-2545 and PI-2566. Further, the film material may be inorganic material or organic material other than polymide, and the film material may be crystalline rather than amorphous.

Coming now to the component film 7 of the composite film 5, such film 7 is a Langmuir-Blodgett polyimide film prepared from a layer one molecule thick of amphiphilic material comprising the mentioned compound PI-2555 and transferred from an air-water interface to the assembly of body 1, conductors 3 and adhering component layer 6. In other words, film 7 is an L-B monolayer film.

To effect such transfer, the amphiphilic material is floated on water in, for example, a Joyce-Loebl trough to form the mentioned monomolecular L-B layer on the water surface. That layer is then caused to transfer from the water surface to the outer surface of film 6 in the assembly 1, 3, 6 by passing that assembly from one side to the other of the air-water interface by first a downstroke and then an upstroke in such manner as, in both strokes, to intercept the monomolecular L-B layer. Concurrently, the surface pressure of the monolayer is regulated. Satisfactory results can be obtained by transfer of the film at 4 mm/minute from a monolayer at the interface compressed to a surface pressure of 25 dynes/cm. Methods of effecting such transfer of an L-B monolayer film (and, also, multilayer films) unto a substrate surface are, in general, well known in the art. Further details on such transfer methods are disclosed in the article by Chris Pitt entitled "Langmuir-Blodgett films—the ultrathin barrier", published at pages 226-229 of the March 1983 issue of *Electronics and Power* and in the article by M. C. Petty entitled "Langmuir-Blodgett films" published at pages 65-69 in Volume 7, No. 2 of the publication *Endeavor, New Series* printed in Great Britain in 1983, both such articles being incorporated herein by reference and made a part hereof.

After the films 6 and 7 of the FIG. 1 device have been deposited on the device they are cured by methods later described herein in more details. Such curing of the two films may take place sequentially (film 7 after film 6) or simultaneously.

Film 7 is composed of the same polyimide material as film 6. Such L-B monolayer film has a thickness of about 30 Angstrom units to be much thinner than the film 6 of 2 micron thickness. In fact, the thickness of film 7 is only about 0.0015 the thickness of film 6.

In articles according to the invention other than the FIG. 1 device as disclosed above, film 7 may be composed of different material then film 6 and may be prepared from material different from the mentioned PI-2555. For example, but without restriction, film 7 may be prepared from one or the other of Du Pont materials PI-2545 and PI-2566. An advantage in the use of PI-2566 is that it is a fluorinated polyimide material so as to impart low wettability to the outer surface of film 7. Low wettability is however, to be distinguished from the improved resistance to moisture of a material which is discussed at length herein, and which refers to improved resistance to alteration over time by exposure to moisture (in the form of, say, environmental steam, water vapor or liquid water) of a behavior characterizing or associated with such material.

As another variant, instead of L-B film 7 being a monolayer, it may be a Langmuir-Blodgett multilayer film. We have discovered that such a cured multilayer film (when prepared from 5 to 9 uncured L-B monolayers superposed on a substrate in a well known manner and thereafter cured) has better resistance to moisture (in the form, say, of better resistance to delamination) than do spun cast films of the same material.

Figure 2:
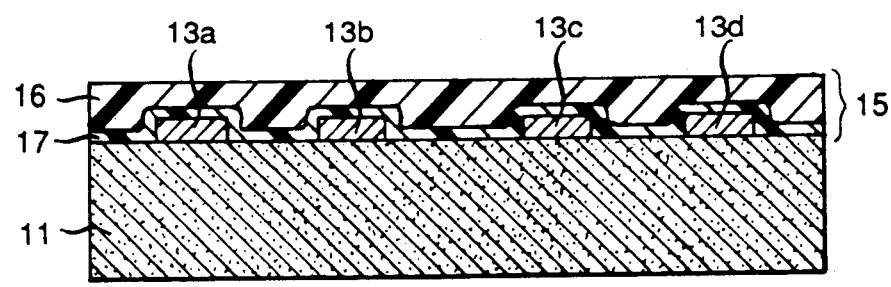
FIG. 2 is a schematic representation not-to-scale in vertical cross-section of another article according to the invention.

FIG. 2 shows a microelectronics device comprising a substrate body 11 with a base surface 12, conductors 13a–13d on that surface, and a composite film 15 adhering to that surface and consisting of a bulk amorphous polyimide spun cast component film 16 and a polyimide Langmuir-Blodgett component monolayer 17. The elements 11, 12, 13a–13d, 15, 16 and 17 of the FIG. 2 device are counterparts of the elements 1, 2, 3a–3d, 5, 6 and 7 of the FIG. 1 device. The device shown in FIG. 2 differs from that of FIG. 1 in that, in the FIG. 2 device, the component films 16 and 17 of composite film 15 are reversed compared to the component films 6 and 7 of FIG. 1 in that film 17 is the one directly adhering to the base surface of the substrate body, and film 16 is the one occupying the outward position in the composite film relative to the substrate body. We have found in earlier studies that an L-B film adheres better to the substrate used than does a spun cast film. Apart from the difference just described, the FIG. 2 device is similar to the FIG. 1 device, and the disclosures already given herein pertaining to the elements 1, 3a–3d, 5, 6 and 7 of the FIG. 1 device apply equally to their respective counterpart elements 11, 13a–13d, 15, 16 and 17 in the FIG. 2 device.

Figure 3:
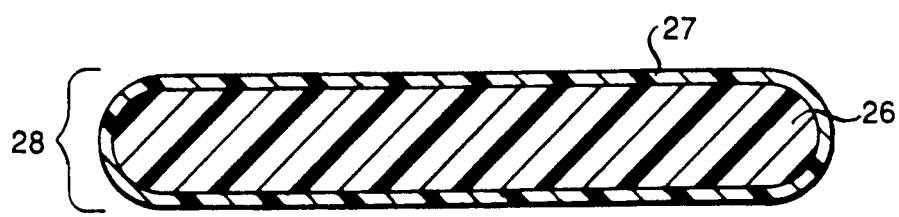
FIG. 3 is a schematic representation not-to-scale in vertical cross-section of yet another article according to the invention.

FIG. 3 depicts an article sometimes referred as a "free film". That article comprises a central sheet 26 of polyimide material sold by the Du Pont company under the name of KAPTON ®. Sheet 26 is in bulk form. Adhering to sheet 26 on its opposite sides and at both margins is Langmuir-Blodgett polyimide monolayer 27. Elements 26 and 27 form a composite film 28 in which such elements are component films. Film 27 is similar to the film 7 of the FIG. 1 device and is deposited on film 26 in the same way as film 7 is deposited on film 6 as described above. The composite film 28 FIG. 3 is usable, for example, without restriction, in packaging.

DETAILED DESCRIPTION OF METHODS AND TESTS

In this section there will be disclosed methods for preparing and/or testing thin films including composite films according to the invention.

An outline of such methods insofar as they pertain to polyimide L-B films is as follows:

I. Preparation of Amphiphilic Material
  1. Most polyimides are deposited as polyamic acid, then imidized by heat or chemicals.
  2. A polyamic acid alone cannot be deposited as an L-B film. A polyamic acid alkylamine salt is used.
  3. The polyamic acid used for these methods is the Du Pont Pyralin ® 2555 material.
  4. Preparation of polyamic acid alkylamine salt from the Du Pont materials.
     a. The polyamic acid is sold by Du Pont already in a solution of N-Methyl-2-Pyrrolidone. The material is further diluted in a solution of 1:1 benzene/dimethylacetamide, to a concentration of 1 mmolar of polyamic acid (PAA).
     b. A 1 mmolar solution of N,N-dimethylhexadecylamine (DMHD Am) in 1:1 benzene/N,N-dimethylacetamide is prepared separately.
     c. The two solutions are then mixed together in a ratio of 1 part PAA to two parts DMHDAm to form a 0.33 mmolar solution of polyamic acid alkylamine salt. The material is now ready for deposition as an L-B film by floating the material on water in a Joyce-Loebl trough and then transferring the resulting L-B film to a substrate as described above.

II. Forming the L-B Film
  1. General Parameters
     a. Deposition Parameters
        (1) Deposition Surface Pressure- 25 dynes/cm.
        (2) Substrate Dipping Speed- 4 mm/minute.
  2. Parameters for Curing L-B Films Deposited on Substrate
     (1) Thermal
        (a) 5° C./minute ramp from ambient to 175° C.
        (b) A one hour dwell at 175° C.
        (c) 5° C./minute ramp to 350° C.
        (d) Two hour dwell at 350° C.
        (e) All steps are performed under nitrogen purge.

Figure 4:
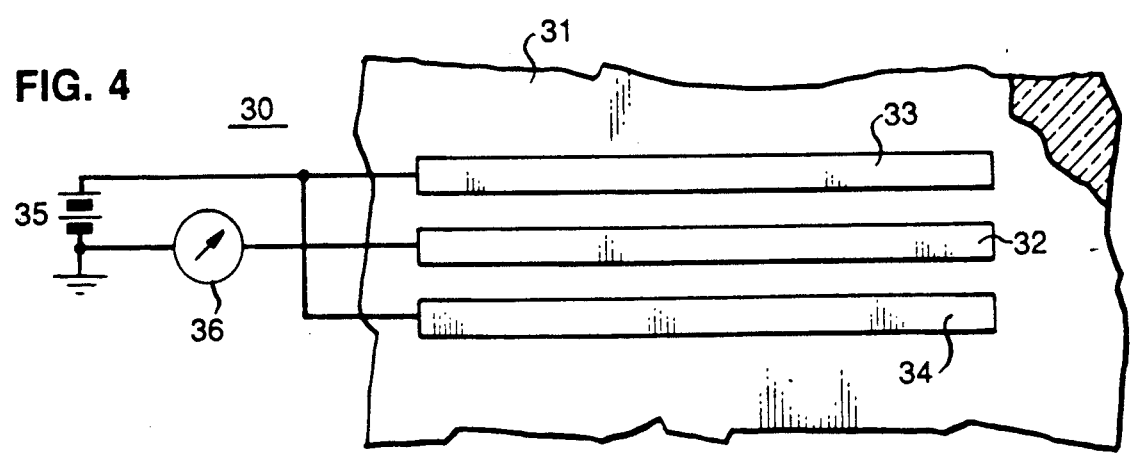
FIG. 4 is a schematic representation in plan view of apparatus for testing composite films which are according to the invention.

The foregoing methods were carried out for the purpose of enabling testing of L-B films and, also, of composite films according to the invention by a procedure disclosed in an article by R. G. Mancke entitled "A Moisture Protection Screening Test for Hybrid Circuit Encapsulants" published at the 31st Electronics Components Conference of the IEEE held at Atlanta, Ga. May 11-13, 1981, such article being available from the IEEE and being incorporated herein by reference and made a part thereof. FIG. 4 hereof (a reproduction of a figure in that article) shows schematically the test apparatus 30 used for the tests. In that apparatus, a substrate 31 of alumina ($Al_2O_3$) has adhering thereto on its upper surface three parallel metal lines forming a "triple track circuit" and consisting of a center line 32 and outer lines 33, 34 on either side of line 32. All of such lines have a length of 21.6 cm. and a width of 76 microns. Outer lines 33, 34 are separated from center line 32 by 76 micron spacings. The mentioned lines each consists from bottom to top of superposed thin layers of titanium, palladium and gold. Electrically speaking, lines 33, 34 are shorted together at one end and are connected through a 180 volt d.c. voltage source 35 to ground. The center line 32 is grounded. While lines or "tracks" 32, 33, 34 are shown in FIG. 4 as being straight, in practice they are bent so as to zig-zag back and forth in a 24-pin dual in-line package (DIP) in a manner permitting fitting thereunto of the full length of the tracks.

The film to be tested is deposited on substrate 31 so as to completely cover tracks 32, 33, 34 and the areas of the substrate's upper surface which lie between these tracks. The manner of deposition depends on the nature of the film desired to be tested. Thus, for example, if it is a composite film comprising an underlying bulk amorphous film and an overlying L-B film, the underlying film is first deposited on substrate 31 by spin casting, and the overlying L-B film is then deposited by dipping in a Joyce-Loebl trough the substrate with the spun-cast film thereon. After a film has been deposited on the substrate and (in some cases) subjected to further processing, the film is tested. The test made thereto is to measure over a time period by a current measuring instrument 36 the leakage current between the outer tracks 33, 34 and the central track 32.

An outline of the testing performed by the FIG. 4 apparatus is as follows:

I. Electrical Test—The referred to article by R. G. Mancke has more detailed information on aspects of the electrical test used.
  1. Substrates used—24 pin DIP Ti-Pd-Au "triple track" pattern on ceramic.
  2. Deposition procedure—The triple tracks were divided into seven groups, each group was deposited with a different scheme. They were as follows:
     a. Blank—no L-B or spun-on film was deposited.
     b. Just L-B—only one monolayer of L-B deposited polyimide was used. The film was thermally cured.
     c. Just spun-on—a 2 microns thick bulk amorphous film was deposited by spun casting and thermally cured.
     d. L-B on top of cured spun-on—a two micron spun-on film was deposited and thermally cured, and L-B monolayer was then deposited on top of the cured spun-on film and the L-B film was thermally cured.
     e. L-B on top of uncured spun-on—a two micron spun-on film was deposited. The film was given a 100° C. bake in air for one hour to remove excess solvent. An L-B film was then deposited on top of the uncured polyamic acid and both were thermally cured.
     f. Spun-on on top of cured L-B—an L-B film was deposited and thermally cured. A 2 micron spun-on coating was then deposited on top of the L-B film and thermally cured.
     g. Uncured L-B under spun-on—An L-B film was deposited and a 2 micron spun-on film was placed on top. They were then both thermally cured.
  3. Temperature-Humidity Bias Test
     a. All seven groups were then placed in the following conditions:
        (1) 85° C.

Figure 5:
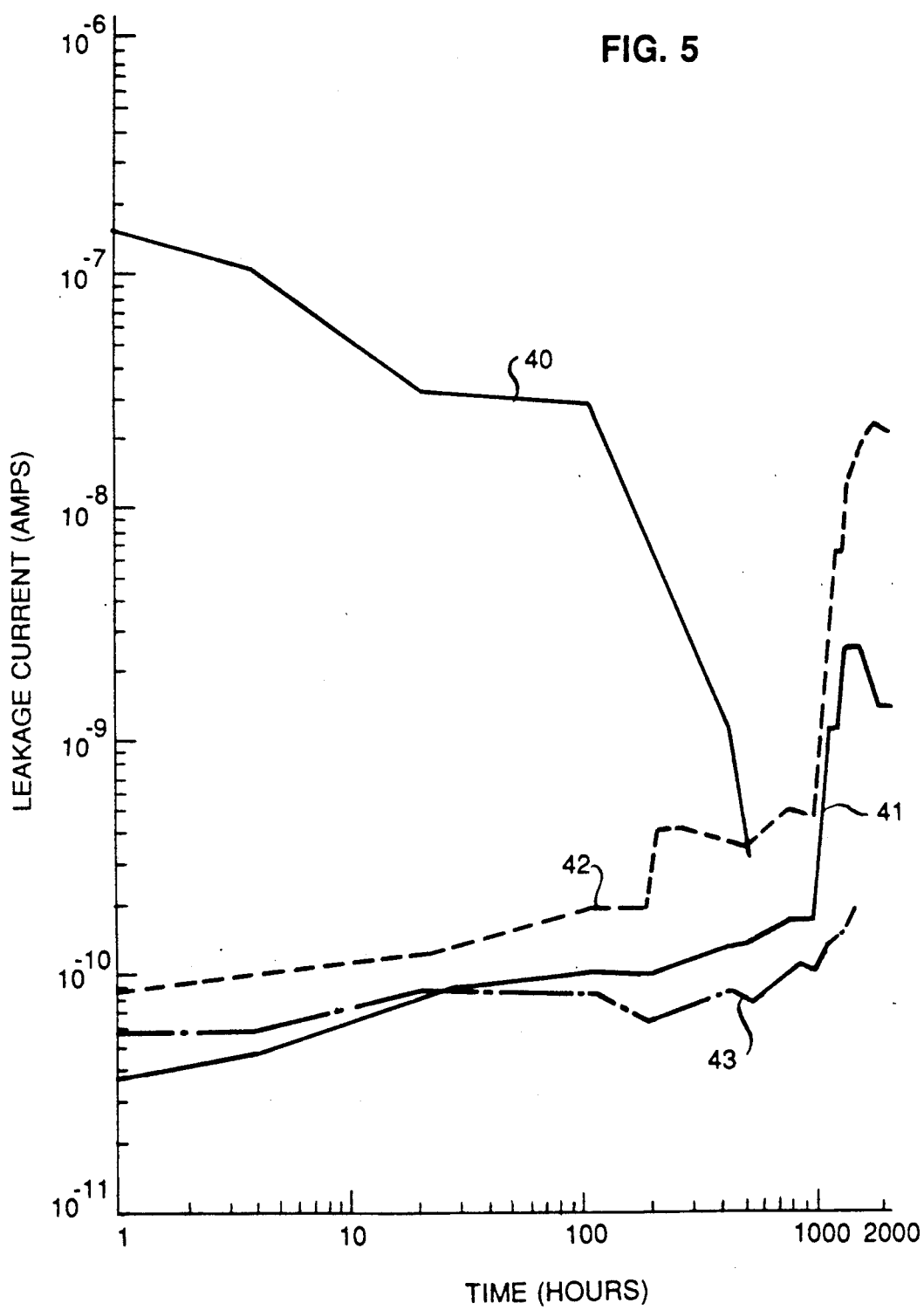
FIG. 5 is a graphical diagram of the results of tests run on the apparatus of FIG. 4.
Figure 6:
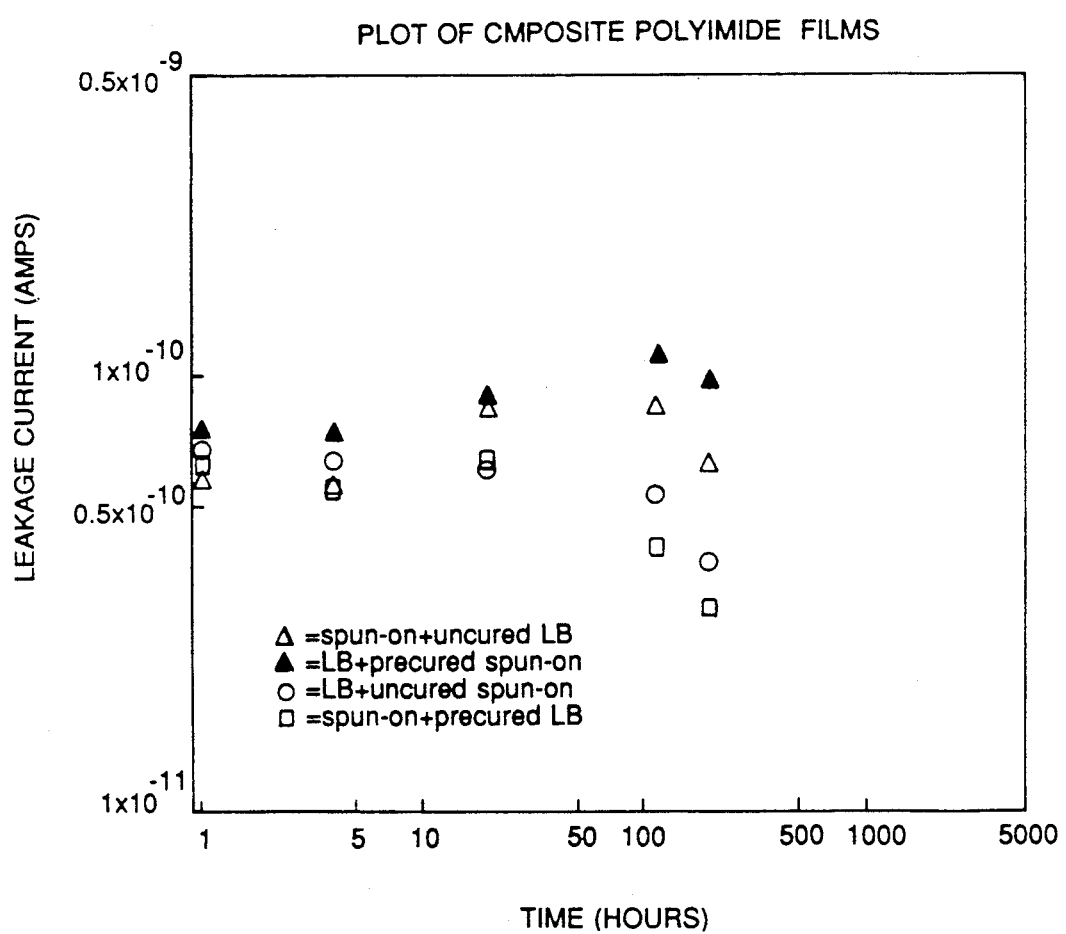
FIG. 6 is a graphical diagram enlarging upon certain of the test results shown in FIG. 5.

(2) 85% relative humidity (3) The two outer tracks of the triple tracks were biased at +180 V while the inner track was grounded. So the film is stressed at 180 V.

b. The leakage current between the inner and outer tracks is then periodically measured.

c. The samples were tested for 2000 hours.

d. Results—The behavior of the apparatus with no film at all thereon is shown in FIG. 5 by line 40. The results showed by graph line 41 that the spun on material, without an L-B film maintained a fairly low leakage current for 1000 hours before suddenly jumping to unacceptable levels. This is known, typical behavior for polyimide films. As indicated by graph line 42, the L-B monolayer alone showed sudden jumps twice, one at a little over 100 hours, the other near 1000. The four separate groups of composite L-B and spun on films showed no substantial difference in behavior and accordingly, are represented by a single line 43. It didn't seem to matter whether the L-B film was on the top or bottom or whether the deposition occurred on a cured or uncured film. FIG. 6 shows the data spread of the four different composite films. It can be seen that the composite films remained stable for twice as long as the spun-on alone. At 2000 hours when the test had stopped, the leakage current was beginning to rise, but was still far below that of the L-B monolayer alone (line 42) or the spun-on film alone (line 41).

From FIG. 5, it will be evident that, when improved moisture resistance is measured in terms of lowered leakage current, at 100 hours the L-B monolayer alone (line 42) had much poorer moisture resistance than did the spun cast film alone (line 41) but that, on the other hand, when the monolayer was combined with the spun cast film, all the resulting composite films (line 43) had substantially better moisture resistance than did either of their component films. This was so even though the composite films were of approximately the same thickness as the spun cast films which were components thereof. Moreover, as the hours of the test increased beyond 100 hours to 2000 hours, the improvement in moisture resistance of the composite film 43 over the L-B monolayer 42 and spun cast film 41 became much greater than at 100 hours. These results are, it is submitted, surprising and not readily explainable.

The above-described embodiments, methods and tests being exemplary only, it is to be understood that additions thereto, omissions therefrom and modifications thereof can be made without departing from the spirit of the invention, and that, accordingly, the invention is not to be considered as limited save as is consonant with the scope of the following claims.

We claim:

1. The combination comprising:

a substrate body, a plurality of electroconductive elements disposed in spaced relation of the surface of said body, and a composite film adhering to said body and coating said electroconductive elements and surface areas therebetween of said body, said composite film comprising:

a first film of dielectric material other than a Langmuir-Blodgett film and a second Langmuir-Blodgett film prepared from amphiphilic material and thinner than said first film, said two films being in superposed relation with each other, and said Langmuir-Blodgett film rendering said composite film more moisture resistant than either of said first and second films taken alone.

2. A combination according to claim 1 in which said first film is a spun cast film.

3. A combination according to claim 1 in which said first film is of amorphous internal structure.

4. A combination according to claim 1 in which said first film is of a thickness in the range between and including 2 microns and 10 microns.

5. A combination according to claim 1 in which said dielectric material is a polyimide compound.

6. A combination according to claim 1 in which said Langmuir-Blodgett film consists of a Langmuir-Blodgett monolayer.

7. A combination according to claim 1 in which said Langmuir-Blodgett film is constituted of a polyimide compound.

8. The combination comprising:

a substrate body, a plurality of electroconductive elements disposed in spaced relation on a surface of said body, and a composite film adhering to said body and coating said elements and surface areas therebetween of said body, said composite film comprising a first spun cast amorphous film of polyimide material and a second Langmuir-Blodgett film of polyimide material and thinner than said first film, said first and second films being in superposed relation with each other, and said Langmuir-Blodgett film rendering said composite film more moisture resistant than either of said first and second films taken alone.

* * * * *